(12) United States Patent
Luu et al.

(10) Patent No.: US 7,719,377 B2
(45) Date of Patent: May 18, 2010

(54) ALTERNATING DIGITAL RF MODULATION

(75) Inventors: Ky Thoai Luu, Victor, NY (US); David Geier, Dayton, OH (US)

(73) Assignee: Harris Corporation, Melbourne, FL (US)

( * ) Notice: Subject to any disclaimer, the term of this patent is extended or adjusted under 35 U.S.C. 154(b) by 994 days.

(21) Appl. No.: 11/477,197

(22) Filed: Jun. 28, 2006

(65) Prior Publication Data
US 2008/0002764 A1    Jan. 3, 2008

(51) Int. Cl.
H03K 7/08 (2006.01)
(52) U.S. Cl. .................. 332/109; 332/110; 332/112; 375/239; 375/297; 327/172
(58) Field of Classification Search ............ 332/109, 332/110, 112; 327/172; 375/239, 297
See application file for complete search history.

(56) References Cited

U.S. PATENT DOCUMENTS

| 4,403,197 A | 9/1983 | Swanson |
| 4,560,944 A | 12/1985 | Furrer |
| 4,580,111 A * | 4/1986 | Swanson ............... 332/152 |
| 4,947,455 A * | 8/1990 | Swanson ............... 455/127.1 |
| 6,970,051 B2 * | 11/2005 | Luu et al. ............... 332/109 |

* cited by examiner

*Primary Examiner*—Arnold Kinkead
(74) *Attorney, Agent, or Firm*—Tarolli, Sundheim, Covell & Tummino LLP

(57) ABSTRACT

A pulse step modulator employs a plurality of series connected unit step power amplifier modules. Each module is turned on by a turn-on signal to provide a unit step voltage of a given value. An output circuit is connected to the modules for providing an output voltage to a load and wherein the output voltage is a multiple of the unit step voltages in dependence upon the number of modules that are turned on. The modules are sequentially turned on in a given order and are turned off in the reverse order. An encoder provides turn-on signals with each turn-on signal being applied to a selected one of the modules. The number of turn-on signals provided varies as a function of the magnitude of a time varying input signal. A controller alternately turns enables or disables (in a swapping manner) one of a pair of associated modules as the magnitude of the input signal increases and decreases.

8 Claims, 4 Drawing Sheets

US 7,719,377 B2

ALTERNATING DIGITAL RF MODULATION

TECHNICAL FIELD

This invention relates to the art of modulators and, more particularly, to pulse step modulators which are particularly applicable for use in AM radio broadcasting.

BACKGROUND OF THE INVENTION

A pulse step modulator is disclosed in U.S. Pat. No. 4,403,197. Briefly, a pulse step modulator (PSM) as disclosed in that patent includes a plurality of series connected unit step modules each of which includes an isolated DC voltage source, a remotely controlled switch and a series diode. The switch in each module may be remotely controlled to turn the module on or off. As each module is turned on, it provides a step voltage. As the various modules are turned on in a stepwise fashion, the output voltage will increase in steps from 0 volts to a maximum voltage with the maximum equaling the sum of all of the module DC voltage sources. A lowpass filter at the output may be employed for removing switching noise. An encoder or the like monitors a time varying input signal, such as an audio signal, and turns on one of the unit step modules for each incremental increase in the value of the audio signal. As the audio signal continues to increase in value, the modules are turned on one at a time in a given order. Similarly, as the audio signal decreases in value, the modules are sequentially turned off in the reverse order.

As noted above, when a pulse step modulator is employed in an AM transmitter, the number of modules that are turned on varies with modulation, i.e., the magnitude of the audio signal. Some modules are on almost all of the time. They only turn off at the negative peak of modulation. Some modules are off most of the time, as they only turn on at the positive peak of modulation. Therefore, there is a large difference in the average power dissipation at the various modules that are required for such a pulse step modulator. That is, if such a pulse step modulator has 46 unit step modules, then unit step module 1 will have the largest amount of power dissipation because it is turned on most of the time, whereas unit step module 46 will have very little power dissipation because the module is turned on very seldom. This causes a large difference between these two modules. Thus, the power dissipated by the various modules is unequal.

In an attempt to equalize the loading of the various modules in such a pulse step modulator, the prior art has included a first on-first off system employing a monitor which monitors the operation of the various modules. As the input signal increases in magnitude, the module that has been turned off the longest will be the first to be turned on. Conversely, as the input signal decreases, the module that has been turned on the longest will be the first to be turned off. Such a system is disclosed in the U.S. Pat. No. 4,560,944 to A. Furrer. This first on-first off system requires a monitoring circuit for monitoring the operation of various modules and hence, this may add to the cost of such a system.

In the discussion presented thus far, each power amplifier module has one unique address location associated with a modulation level. For example, if 20 modules are turned on, the next module to be turned on is module number 21 and so forth. Based on the magnitude of the input signal being amplified, an appropriate number of power amplifier modules are turned on to synthesize the output signal that is needed. These modules are turned on in a sequential order starting from the bottom of a ladder to the top of a ladder. A small input signal requires enabling only a few of the bottom power amplifier modules. For example, an AM digital step transmitter may be considered as being capable of providing an envelope modulation up to 100%. Therefore, to produce only the carrier power at 0% modulation, this may require 50 RF power amplifiers being turned on. The output per amplifier will vary widely as can be seen from FIG. 2 herein. This figure illustrates, in graphical form, the output power with respect to the number of power amplifier modules employed. With only one amplifier turned on, it is operating at 100% power.

It should be noted that the power supplied by the power amplifier modules is not equal in the prior art. Therefore, the power amplifier usage of this type of system is poor and drives up the cost of the system.

SUMMARY OF THE INVENTION

The present invention is directed to a pulse step modulator that employs a plurality of series connected unit step power amplifier modules with each module including a DC voltage source that is turned on by a turn-on signal to provide a unit step voltage of a given value. An output circuit is connected to the modules for providing an output voltage to a load and wherein the output voltage is a multiple of the unit step voltages in dependence upon the number of modules that are turned on. As an input signal increases in value, the modules are sequentially turned on in a given order and are turned off in the reverse order as the input signal decreases in value. Each incremental change in magnitude of the input signal results in a corresponding turn on or turn off of one of the modules. An encoder provides turn-on signals with each turn-on signal being applied to a selected one of the modules and a number of turn-on signals provided varies as a function of the magnitude of a time varying input signal applied to the encoder. A controller alternately turns on or off (in a swapping manner) each one of a pair of associated modules as the magnitude of the input signal increases and decreases. The alternate swapping of the modules in each pair is under the control of the controller.

BRIEF DESCRIPTION OF THE DRAWINGS

The foregoing and other objects and advantages of the present invention will become more readily apparent from the following description as taken in conjunction with the accompanying drawings wherein.

DESCRIPTION OF PREFERRED EMBODIMENT

Figure 1:
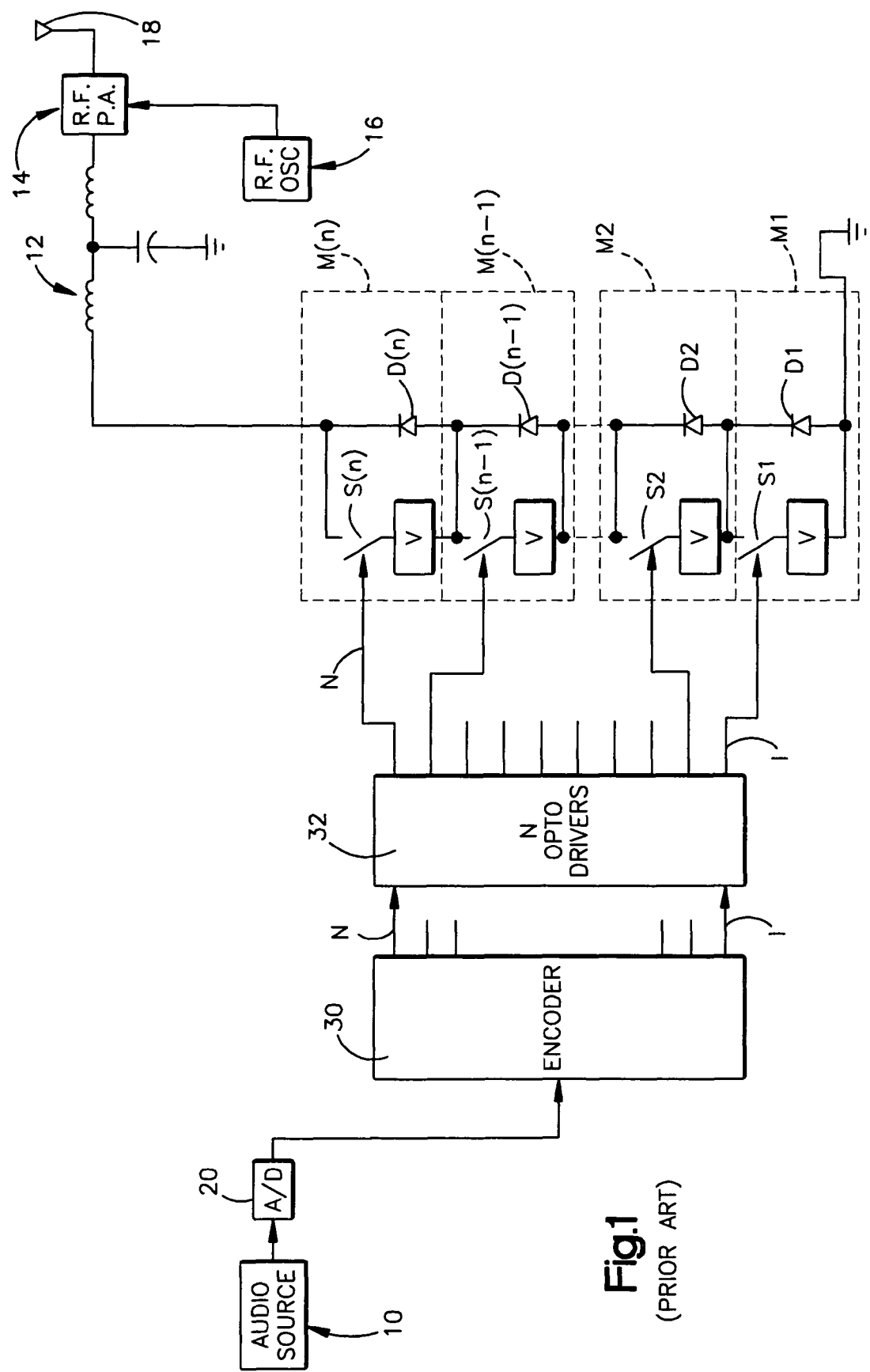
FIG. 1 is a schematic-block diagram illustration of a prior art AM broadcasting transmitter employing a pulse step modulator.

Reference is now made to the drawings wherein the showings are for the purpose of illustrating preferred embodiments of the invention only and not for the purpose of limiting the same. FIG. 1 illustrates an AM transmitter which incorporates a prior art pulse step modulator (PSM). The transmitter includes an audio source which generates an amplitude and frequency varying audio signal which is to be amplified and transmitted. This signal is supplied to the pulse step modulator PSM, to be described in greater detail hereinafter, and which provides a resulting amplitude signal $V_{out}$ to a lowpass filter 12. The resulting amplified and filtered signal is then supplied to the audio input of a conventional RF power amplifier 14 where it amplitude modulates an RF carrier signal supplied by an RF oscillator 16. The resulting AM signal is then transmitted by a conventional antenna 18.

The pulse step modulator (PSM) includes a conventional analog-to-digital converter 20 which receives the analog audio signal from the audio source 10 and converts it into a multibit digital representation thereof.

The bits are supplied to an encoder 30 having N output circuits which are supplied to an optical driver circuit 32. Circuit 32 has N output circuits respectively connected to N unit step switches S1 through SN. Switches S1 through SN are respectively located in unit step modules M1 through M(N).

The encoder 30 sequentially energizes its output circuits 1 through N with incremental increases in the magnitude of the analog signal and de-energizes the output circuits in the reverse order with incremental decreases in the magnitude of the analog signal. These are reflected through the optical driver circuit 32. The optical driver circuit has output circuits 1 through N which serve to sequentially close switches S1 through SN as the analog input signal incrementally increases in magnitude and to sequentially open the switches, in the reverse order, as the input analog signal incrementally decreases in magnitude. Whenever a switch S1 through SN is open, the associated unit step module is turned off and whenever a switch is closed, the associated unit step module is turned on.

Each unit step module M1 through M(N) includes an incremental unit step voltage source V, a switch such as switch S1 and a diode such as diode D1 all interconnected as shown with respect to module M1 in FIG. 1. The unit step modules are connected together in series with diodes D1 through D(N). Each incremental voltage source may be considered as a DC voltage source of a fixed magnitude which, in practice, may be on the order of 600 volts.

The output voltage that will be supplied to the filtering circuit 12 will be the sum of all of the unit step voltage sources that have been turned on. The contribution by the various unit step voltage sources varies over time with increasing and decreasing values of the input signal. The unit step voltage sources associated with the lower values of the input analog signal are turned on the longest and the unit step voltage sources associated with the highest values of the input analog signal are turned on the shortest periods of time. Thus, the output circuits of encoder 30 are sequentially turned on in the order from circuit 1 through circuit N as the analog signal continuously increases in magnitude. The unit step module associated with circuit 1 is turned on for the longest time duration during a given operating period and the module associated with output circuit N will be on the shortest time duration. The module associated with step 1 has a large amount of power dissipation, whereas the module associated with step N has relatively little power dissipation. This will cause a large difference between these two modules with resulting overloading and injury to the circuitry employed.

In the prior art, as shown in FIG. 1, the module M1 is associated with step 1 and module M2 is associated with step 2 and so on, with module M(N) being associated with step N. Consequently, there is a large difference in the mount of power dissipated by module M1 relative to that by module M(N) since the former is turned on most of the time and latter is turned off most of the time.

The prior art as discussed above with references to FIG. 1 and FIG. 2 may be considered as a fixed power amplifier location technique. Each amplifier has one unique address location associated with its modulation position for the modulation signal. Based on the output signal level, the appropriate number of power amplifier modules are enabled to synthesize the output signal that is needed. A small output signal requires only the enabling of the bottom power amplifiers in a structure considered as an amplifier ladder. Thus, ½ of the power amplifiers may deliver over 75% of the total output power.

In the present invention, the modulation operation is identical to that discussed above. However, in the present invention, each power amplifier module has an opportunity to swap with the opposite power module while the signal modulation process takes place. As will be seen, the average power dissipated by each power amplifier module is reduced by up to 50%. This is accomplished by an assignment to improve the operational duty cycle while maintaining a clean spectral output. This swapping of power amplifier modules shares the output power dissipation among all of the modules.

Figure 2:
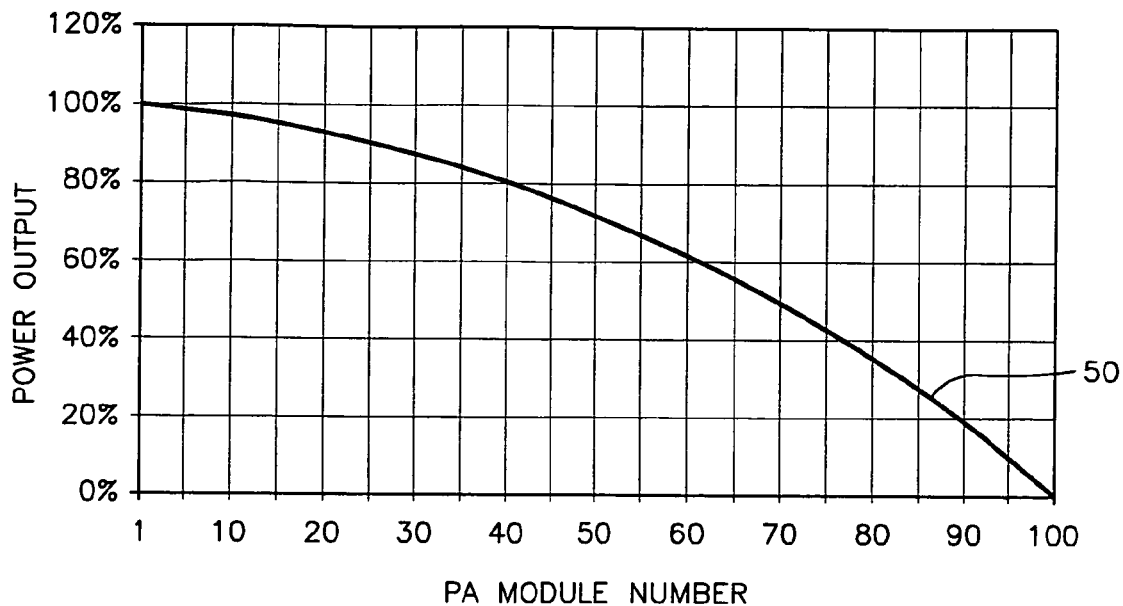
FIG. 2 is a graphical illustration of output power relative to power amplifier module number representative of the prior art of FIG. 1 and which is useful in describing the background of the invention herein.

As shown in FIG. 2, the power distribution between the power amplifier modules are depicted. It is to be noted that 100 power amplifier modules are on the X axis and the output power dissipated at the amplifiers is plotted on the Y axis. The power dissipated at module number 1 is 100% whereas the power dissipated by module number 100 is at approximately 0%. This is a poor power utilization of the prior art.

In the present invention, for example, 100 power amplifier modules may be used for a total of 50 pairs of power amplifier modules. Power amplifier module number 1 is paired with power amplifier number 100. Power amplifier 2 is paired with power amplifier number 99, and so forth. The power dissipated is averaged out among the modules as will be seen from the description below.

Figure 4:
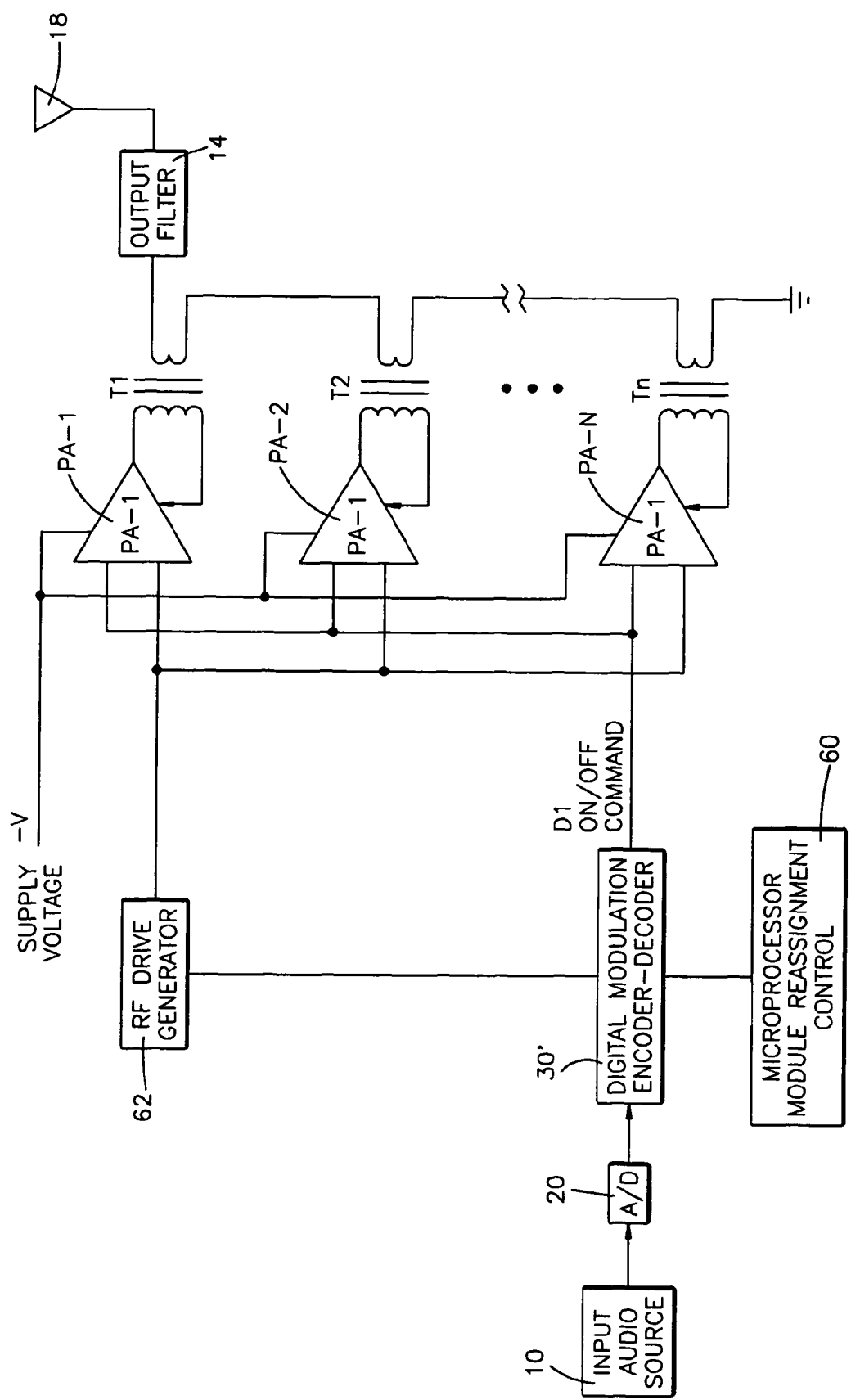
FIG. 4 is a schematic-block diagram illustration of a preferred embodiment of the present invention.

As will be noted from the description that follows with reference to FIG. 4, each pair of power amplifier modules is commanded by a modulation encoder to swap addresses at a fixed predetermined frequency. A swapping frequency is selected to have a minimum impact to the modulation content and minimized spurious outputs. There is only one pair of amplifier modules swapping taking place at any one time. This minimizes any unwanted spurious operation that may be generated because the power amplifier modules are not exactly identical in the power dissipation and in the output phasing.

The power amplifier modules of each pair swap back and forth at a duty cycle of 50%. This allows an equal power sharing between the power amplifier modules of each pair.

After amplifier module number 1 has been swapped with amplifier module number 100, a fixed time period later (depending upon the swapping frequency employed), power amplifier module number 2 will be swapped with power amplifier number 99 and so forth. This modulation process repeats until the last pair has been swapped. After the last pair has been swapped, the modulation process starts from the beginning again. That is, the process starts over again, amplifier module number 100 is swapped with amplifier module 1 at the original address location. This modulation process continues in an endless loop.

Figure 5:
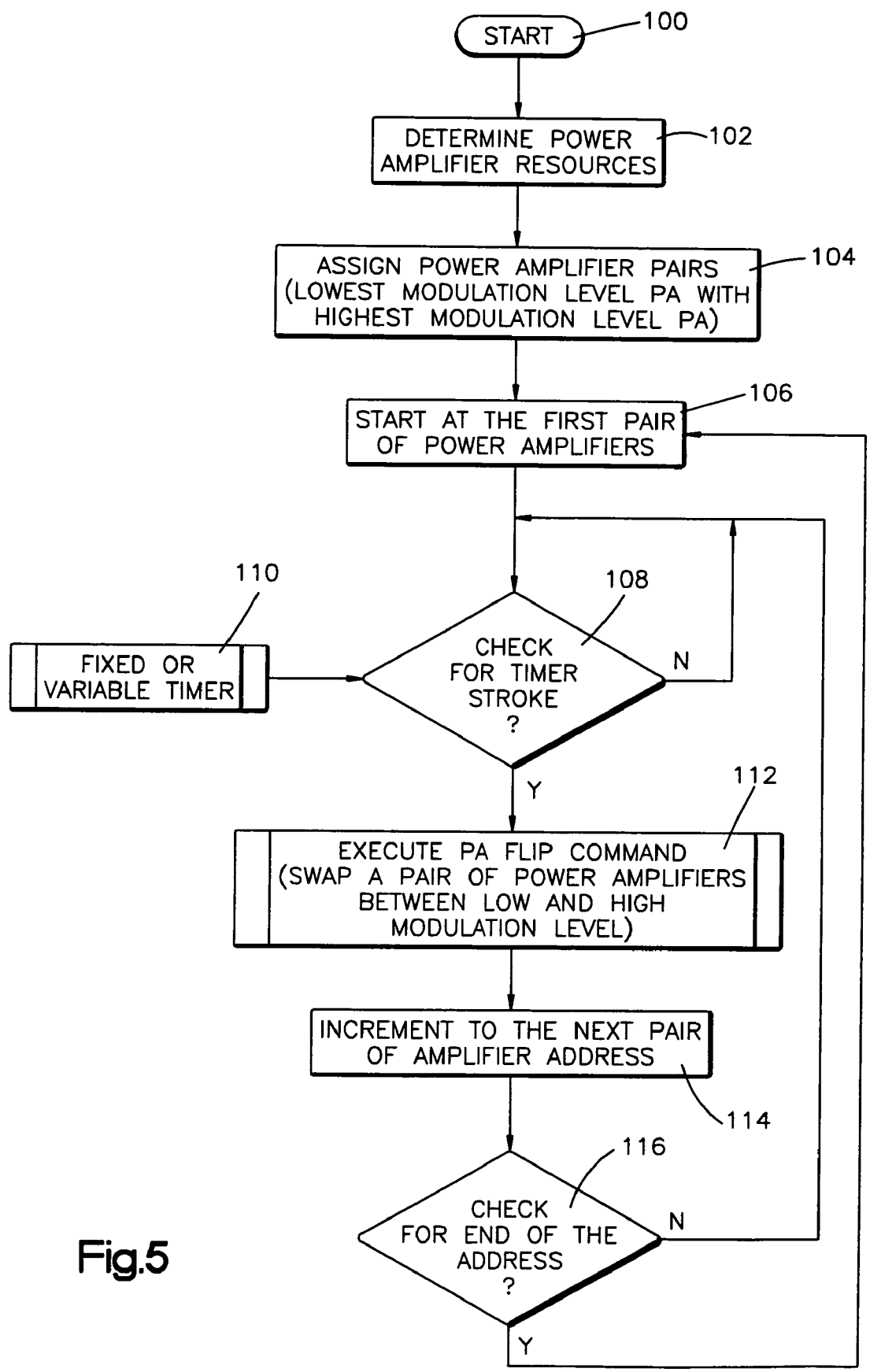
FIG. 5 is a flowchart illustrating the manner in which the microprocessor is programmed in accordance with the present invention.

This is all in accordance with the program employed in the microprocessor of FIG. 4. The microprocessor is programmed in accordance with the flowchart as shown in FIG. 5 to be discussed hereinafter.

The purpose of pairing power amplifier modules is to average a combined power dissipation of two power amplifiers for better power utilization. After a 50% duty cycle swapping for the first pair of amplifier modules (amplifier module number 1 and amplifier module number 100), the output power utilization of amplifier module number 1 is reduced to 50% and that of amplifier module 100 is increased to 50% from 0%. This is a significant benefit to amplifier module number 1 because this reduces the power dissipation. Consequently, the amplifier modules can be made smaller due to the reduction in average output power.

Figure 3:
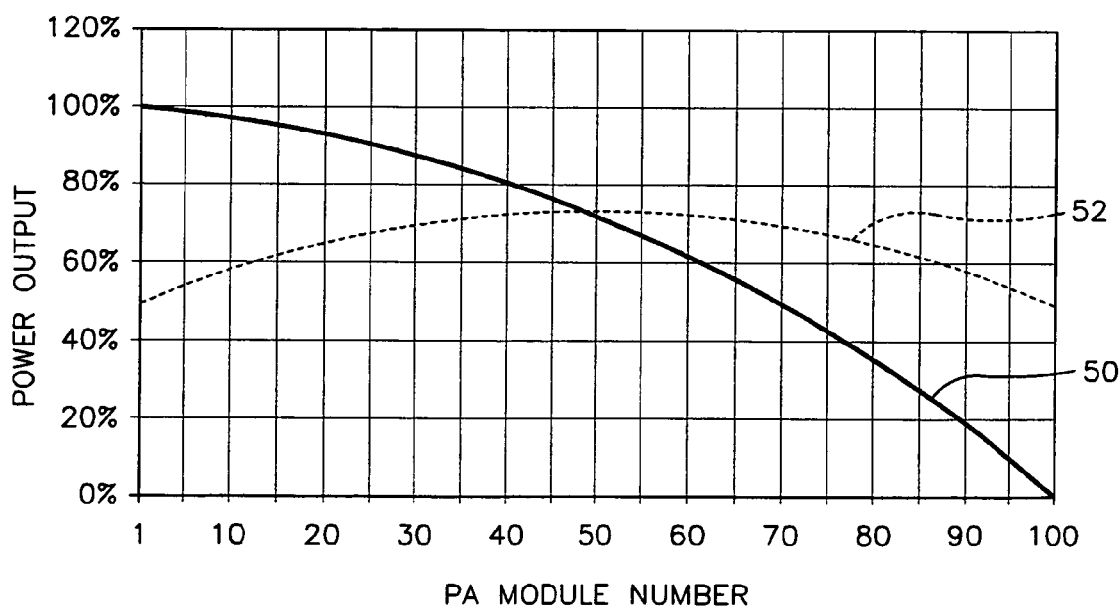
FIG. 3 is a graphical illustration similar to that of FIG. 2 but illustrating the operation that takes place with the present invention.

It is to be noted that FIG. 3 illustrates curve 50 from FIG. 1 as well as a new curve 52 which represents the operation that results from practicing the present invention. Note that in curve 52 a power reduction for amplifier number is on the order of 50%.

The foregoing may be achieved with various circuits such as that illustrated in FIG. 4 to which reference is now made. The circuit is similar to that as illustrated in FIG. 1, and consequently, like components are illustrated character references. In FIG. 4, an audio source 10 supplies a signal to an analog digital converter 20 which, in turn, supplies signals to a digital modulation encoded decoder 30'. The modulation encoder is controlled by a microprocessor 60 which is programmed to provide reassignment control as will be described with reference to the flowchart of FIG. 5. An RF drive generator 62 supplies an RF signal to the encoder-decoder 30' as well as to the power amplifier modules PA-1 through PA-N. The outputs of these amplifiers are supplied to the primary windings on a transformer which may take the form of a toroid transformer. The secondary windings are connected together in series to an output filter 14 and, thence, to a broadcasting antenna 18.

In accordance with the present invention the microprocessor 60 is programmed to provide module reassignments in accordance with the flowchart as shown in FIG. 5. In this flowchart, the procedure commences at step 100 and then advances to step 102 at which the number of power amplifier modules is determined. In the example given thus far, the number of power amplifier modules is 100.

The power amplifier module pairs are assigned with the lowest modulation level power amplifier being coupled to the highest modulation level power amplifier module. This takes place at step 104.

The procedure advances to step 106 at which the procedure starts at the first pair of power amplifier modules. In the example given, this is the pair that includes power amplifier module number 1 and power amplifier module number 100.

The procedure advances to step 108. That step receives timing pulses from a timing source 110. In step 108, a determination is made that the timer has provided a timing signal (at a fixed frequency as determined by the procedure herein). The procedure then advances to step 112 during which a flip or a swap takes place between power amplifier modules.

The procedure advances to step 114. The procedure increments to the next module pair. If none of the procedure determines the end at step 106 then it starts over at the first pair.

Although the invention has been described in conjunction with a preferred embodiment, it is to be appreciated that various modifications may be made without departing from the spirit and scope of the invention as defined by the appended claims.

Having described the invention, we claim the following:

1. A pulse step modulator comprising a plurality of series connected unit step power amplifier modules with each said module being turned on by a turn-on signal to provide a unit step voltage of a given value;
    an output circuit connected to the modules for providing an output voltage to a load and wherein said output voltage is a multiple of said unit step voltages in dependence upon the number of modules that are turned on;
    said modules being sequentially turned on in a given order and are turned off in a reverse order as a time varying input signal increases and decreases in value;
    an encoder that provides turn-on signals with each turn-on signal being applied to a selected one of the modules with the number of turn-on signals provided varying as a function of the magnitude of the input signal; and
    a controller that alternately enables and disables (in a swapping manner) one of a pair of associated modules as the magnitude of the input signal increases and decreases.

2. A modulator as set forth in claim 1, wherein said pluralities of modules includes N modules where N is an even number.

3. A modulator as set forth in claim 1, wherein each said turn on signal turns on an enabled one of a said pair of associated modules.

4. A modulator as set forth in claim 3, wherein said pluralities of modules includes N modules where N is an even number.

5. A modulator as set forth in claim 1, wherein said plurality of modules includes N modules divided into pairs of associated modules.

6. A modulator as set forth in claim 5, wherein said pluralities of modules includes N modules where N is an even number.

7. A modulator as set forth in claim 3 wherein said N modules includes modules 1 to N respectively associated with incrementally increasing magnitudes of said input signal.

8. A modulator as set forth in claim 7, wherein N is an even number.

* * * * *